US008692275B2

(12) United States Patent
Jaeger et al.

(10) Patent No.: US 8,692,275 B2
(45) Date of Patent: Apr. 8, 2014

(54) OPTOELECTRONIC COMPONENT AND METHOD FOR PRODUCING AN OPTOELECTRONIC COMPONENT AND A COMPOUND STRUCTURE

(75) Inventors: Harald Jaeger, Regensburg (DE); Michael Zitzlsperger, Regensburg (DE); Albert Schneider, Thalmassing (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/636,678

(22) PCT Filed: May 4, 2011

(86) PCT No.: PCT/DE2011/001037
§ 371 (c)(1),
(2), (4) Date: Dec. 21, 2012

(87) PCT Pub. No.: WO2011/147399
PCT Pub. Date: Dec. 1, 2011

(65) Prior Publication Data
US 2013/0092966 A1    Apr. 18, 2013

(30) Foreign Application Priority Data
May 27, 2010   (DE) .......................... 10 2010 021 791

(51) Int. Cl.
*H01L 33/00*     (2010.01)

(52) U.S. Cl.
USPC ........ 257/98; 257/99; 257/433; 257/E33.058; 257/E33.059; 438/26; 438/33

(58) Field of Classification Search
USPC .............. 257/98, 99, 433, E33.058, E33.059; 438/26, 33
See application file for complete search history.

(56) References Cited

U.S. PATENT DOCUMENTS

| | | |
|---|---|---|
| 6,507,049 B1 | 1/2003 | Yeager et al. |
| 6,900,511 B2 | 5/2005 | Ruhnau et al. |
| 7,586,190 B2 | 9/2009 | Bogner et al. |
| 2004/0075100 A1 | 4/2004 | Bogner et al. |
| 2005/0173708 A1 | 8/2005 | Suehiro et al. |
| 2005/0190561 A1* | 9/2005 | Ng et al. ........................ 362/307 |
| 2006/0091788 A1 | 5/2006 | Yan |
| 2006/0171152 A1 | 8/2006 | Suehiro et al. |
| 2006/0175716 A1* | 8/2006 | Nakashima .................... 257/787 |
| 2007/0045800 A1 | 3/2007 | King et al. |
| 2007/0087174 A1 | 4/2007 | Aizpuru et al. |
| 2008/0210962 A1 | 9/2008 | Blumel et al. |
| 2008/0218072 A1 | 9/2008 | Haruna et al. |
| 2011/0062470 A1* | 3/2011 | Bierhuizen et al. ............. 257/98 |

FOREIGN PATENT DOCUMENTS

| | | |
|---|---|---|
| DE | 102 45 946 C1 | 10/2003 |
| DE | 102 29 067 A1 | 1/2004 |
| DE | 102 45 930 A1 | 4/2004 |
| DE | 10 2005 020 908 A1 | 8/2006 |
| JP | 2007-019096 A | 1/2007 |
| TW | 200629600 | 8/2006 |
| WO | WO 2009/075530 A2 | 6/2009 |
| WO | WO 2010/035206 A1 | 4/2010 |

* cited by examiner

*Primary Examiner* — Tu-Tu Ho
(74) *Attorney, Agent, or Firm* — Slater & Matsil, L.L.P.

(57) ABSTRACT

An optoelectronic component includes a housing. At least one semiconductor chip is arranged in the housing. The semiconductor chip includes an active layer suitable for producing or detecting electromagnetic radiation. A casting compound at least partially surrounds the semiconductor chip. Reflective particles are embedded in the casting compound.

20 Claims, 1 Drawing Sheet

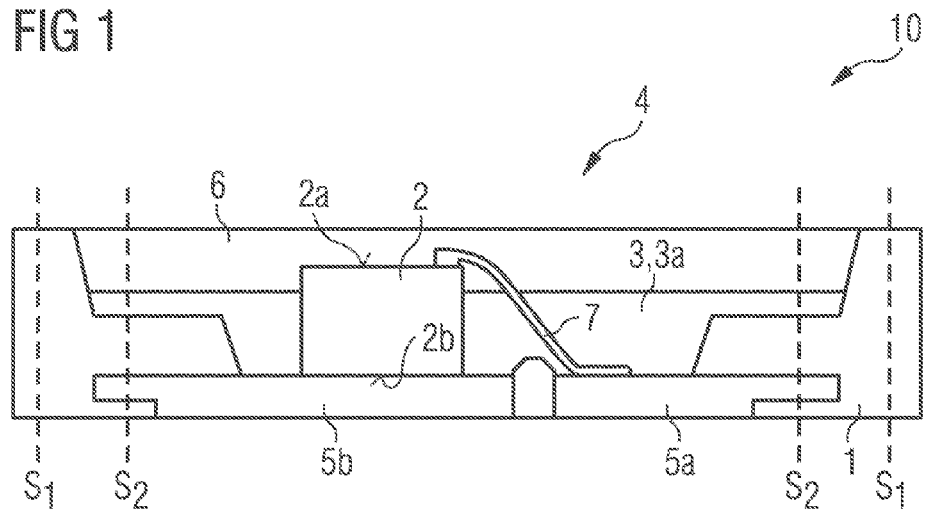
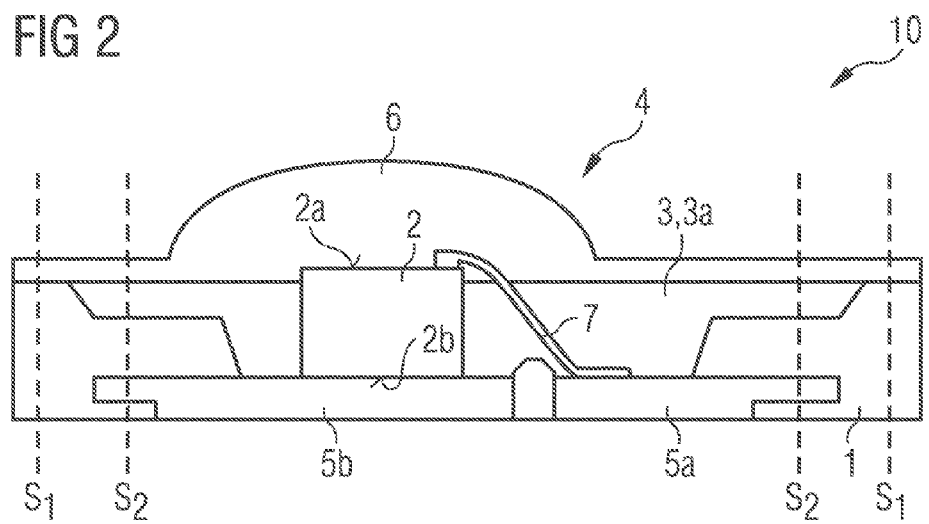

OPTOELECTRONIC COMPONENT AND METHOD FOR PRODUCING AN OPTOELECTRONIC COMPONENT AND A COMPOUND STRUCTURE

This patent application is a national phase filing under section 371 of PCT/DE2011/001037, filed May 4, 2011, which claims the priority of German patent application no. 10 2010 021 791.3, filed May 27, 2010, each of which is incorporated herein by reference in its entirety.

TECHNICAL FIELD

The invention relates to an optoelectronic component comprising a housing and a semiconductor chip. The invention furthermore relates to a method for producing such an optoelectronic component and to a method for producing a compound structure consisting of a multiplicity of optoelectronic components.

BACKGROUND

Optoelectronic components comprising a housing and a semiconductor chip are known, for example, from German Patent Publication No. DE 10 2005 020 908 A1. The housing body is in this case produced by casting around two connecting parts with a suitable casting compound, the semiconductor chip being arranged on one of the connecting parts.

Silicone has, in particular, the advantage of high-temperature stability and UV radiation resistance, but has the disadvantage of low mechanical breaking strength and high material costs in comparison with, for example, epoxide. Epoxide, on the other hand, although it has good thermal stability and low material costs, nevertheless has poor UV radiation resistance.

In the case of conventional optoelectronic components comprising housings made of epoxide, ageing effects due to UV irradiation can occur in the housing material, essentially on the surfaces and to a lesser extent in the bulk material. Such ageing effects are for example yellowing, discoloration, embrittlement, cracking of the housing material, as well as delamination of adhering casting material. These ageing effects may, for example, result from the radiation emitted by the semiconductor chip. Conventional components are therefore limited in their lifetime, particularly when it is necessary for the functional integrity of a component that the surface of the housing material remains intact, for instance when a lens or the like is adhesively bonded on. The ageing effects detrimentally affect the look and appearance as well as the mechanical stability. While in the case of conventional black epoxide as housing material a brightness loss cannot occur owing to the ageing effects, such can be the case with non-black, in particular light or white epoxide. The lifetime may in this case be defined for example as the time taken for the brightness of the radiation emitted by the component to fall to a defined fraction of the initial value.

SUMMARY OF THE INVENTION

One aspect of the invention, while avoiding these disadvantages, provides an optoelectronic component which has reduced degradation of the housing material and therefore an increased lifetime, and at the same time entails low costs in production, for example the material selection.

The invention provides an optoelectronic component which comprises a housing, at least one semiconductor chip arranged in the housing and a casting compound. The semiconductor chip comprises an active layer suitable for generating or detecting electromagnetic radiation. The casting compound at least partially encloses the semiconductor chip, reflective particles being embedded in the casting compound.

An optoelectronic component is, in particular, a component which makes it possible to convert electronically generated energy into light emission, or vice versa. For example, the optoelectronic component is a radiation-emitting or radiation-receiving component.

The semiconductor chip comprises a radiation exit side, from which most of the radiation emitted by the semiconductor chip emerges, the radiation exit side being free of casting compound. For example, the semiconductor chip is a surface-emitting chip, with the casting compound directly surrounding side surfaces of the semiconductor chip. The radiation emitted by the semiconductor chip therefore does not pass through the casting compound, but can be output directly from the component.

As reflective particles in the casting compound, $TiO_2$ particles are for example particularly preferably used. These reflective particles are distributed uniformly in the casting compound. The casting compound, which partially encloses the semiconductor chip, therefore forms a reflective encapsulation of the semiconductor chip.

By the casting compound comprising reflective particles, the radiation emitted by the semiconductor chip is reflected by the housing in such a way that the radiation emitted by the semiconductor chip does not penetrate to the housing material. In particular, the radiation emitted by the semiconductor chip is reflected by means of the reflective particles in the casting compound before this radiation reaches the housing material, in such a way that this radiation is delivered out of the component. In this way, material degradation of the housing material, which may be caused by the influence of the radiation of the semiconductor chip, can advantageously be reduced. Degradation at the housing, which is manifested for example by yellowing or discoloration, embrittlement, delamination and/or cracking in the housing, can therefore be reduced so that the lifetime of such a component is advantageously increased.

In a refinement, the housing comprises a cavity on the base surface of which a lead frame is arranged, on which the semiconductor chip is arranged, the casting compound being introduced into the cavity.

The casting compound comprising reflective particles advantageously covers the housing material at least partially. The proportion of the housing material directly exposed to the damaging UV radiation can therefore be minimized. The casting compound comprising reflective particles is in this case used not only as a reflector to increase the optionally directional light yield, but at the same time as radiation protection for the ageing-susceptible housing material.

In order to produce the housing, the lead frame is preferably molded around with the housing material for example by means of injection molding, injection press molding or press molding. The housing is accordingly formed as a so-called prefabricated housing, for example as a pre-molded housing structure. With such a structure, the semiconductor chip is mounted on the lead frame after production of the housing.

The lead frame preferably comprises a first electrical terminal part and a second electrical terminal part. The semiconductor chip is electrically contacted by means of the electrical terminal parts. The semiconductor chip may, for example, be electrically conductively connected to the first terminal part by means of a connecting layer, for instance an electrically conductive adhesive or a solder layer, and/or it may be fastened thereto. The semiconductor chip is preferably conductively connected to the second terminal part by means of a bonding wire.

In one refinement, the lead frame, which may for example consist of copper and, in particular, the first and second terminal parts, may have a silver coating. As an alternative or in addition, the lead frame may also have a gold, NiPdAu or NiAu coating. Such coatings, like copper, for example exhibit good adhesion to epoxide. Owing to the casting compound comprising reflective particles, the majority of the radiation emitted by the semiconductor chip can be reflected at the reflective particles in such a way that this fraction does not reach the lead frame, so that corrosion protection can advantageously be achieved for the coating.

The semiconductor chip is preferably an LED. Preferably, the semiconductor chip is a thin-film LED. In the context of the application, a thin-film LED is intended to mean an LED during the production of which the growth substrate onto which a semiconductor layer sequence, which forms a semiconductor body of the thin-film semiconductor chip, has for example been epitaxially grown, has been removed.

As an alternative, the semiconductor chip may be a photodiode or a phototransistor. In this case, the semiconductor chip comprises an active layer suitable for detecting electromagnetic radiation.

The active layer of the semiconductor chip preferably comprises a heterostructure, in particular a double heterostructure, a single quantum well structure or a multiple quantum well structure. By means of such structures, in particular a multiple quantum well structure or a double heterostructure, particularly high internal quantum efficiencies can be achieved.

The semiconductor chip, in particular the active layer, preferably contains at least one III/V semiconductor material, for instance a material selected from the material systems $In_xGa_yAl_{1-x-y}P$, $In_xGa_yAl_{1-x-y}N$ or $In_xGa_yAl_{1-x-y}As$, respectively with $0 \leq x, y \leq 1$ and $x+y \leq 1$. III/V semiconductor materials are particularly suitable for radiation generation in the ultraviolet spectral range ($In_xGa_yAl_{1-x-y}N$) through the visible spectral range ($In_xGa_yAl_{1-x-y}N$, in particular for blue to green radiation, or $In_xGa_yAl_{1-x-y}P$, in particular for yellow to red radiation) into the infrared spectral range ($In_xGa_yAl_{1-x-y}As$).

In one refinement, a cover layer is arranged on the casting compound. The cover layer in this case preferably does not comprise reflective particles. The cover layer therefore forms a so-called clear encapsulation.

The cover layer is preferably arranged after the radiation exit side of the semiconductor chip. If the housing comprises a cavity in which the semiconductor chip is arranged, for example, then the cavity is at least partially filled with the casting compound, the cover layer being arranged on the casting compound. The cover layer may in this case close the housing flush with the upper side of the housing. As an alternative, the casting compound may close the housing flush with the upper side of the housing, in which case the cover layer is arranged on the surface which is formed by the upper side of the housing and the casting compound.

In one refinement, at least one conversion material is embedded in the cover layer. Preferably, the conversion material is distributed uniformly in the material of the cover layer.

The semiconductor chip preferably emits primary radiation having a first wavelength. The conversion material in the cover layer preferably at least partially absorbs radiation having the first wavelength and emits secondary radiation having a second wavelength. The component therefore emits mixed radiation, which contains both the primary radiation of the semiconductor chip and the secondary radiation of the conversion material. By a suitable selection of the conversion material, correction of the color locus (also referred to as chromaticity coordinate) of the radiation emitted by the semiconductor chip can be carried out so that a desired color locus of the radiation emitted by the component is obtained.

The color locus is intended in particular to mean the numerical values which describe the color of the emitted light of the component in the CIE color space.

Furthermore, the cover layer may contain more than one conversion material. This leads to mixed radiation of the radiation emitted by the component, which contains primary radiation and a plurality of secondary radiations of the plurality of conversion materials.

By a conversion material introduced into the cover layer, white light may for example be generated. Furthermore, by the use of special conversion materials, for example nitrides or silicates, by conversion of the radiation emitted by the semiconductor chip, radiation emitted by the component in a wavelength range from green to red can be generated. In this case, the colors may be varied in saturation according to the mixing ratio and luminescent material characteristic.

In one refinement of the component, the cover layer is formed as a lens. In this case the lens may have refractive or diffractive properties. The lens may be molded on, for example by a mold pressing method or by another molding method for liquid processing.

In one refinement, the semiconductor chip protrudes from the casting compound in the vertical direction. The radiation exit side of the semiconductor chip is thus not covered with the casting compound. Preferably, the radiation exit side faces the housing upper side, the casting compound directly surrounding the semiconductor chip laterally.

In particular, the direction perpendicular to the base surface of the housing is regarded as a vertical direction.

In one refinement, the cover layer directly adjoins the casting compound. There is therefore no gap, for example air, arranged between the cover layer and the casting compound. For example, air inclusions due to production between the cover layer and the casting compound are not included in this.

In one refinement, the semiconductor chip protrudes in the vertical direction into the cover layer. The semiconductor chip is therefore at least partially surrounded by the cover layer in direct contact. Preferably, the semiconductor chip protrudes into the cover layer with the radiation exit side.

In one refinement, the housing contains an epoxide, an epoxide pressing compound or PPA (polyphthalamide). Epoxide has, in particular, good thermal stability and low material costs. The poor UV radiation resistance of the epoxide material can be counteracted by the casting compound comprising reflective particles.

The housing material is, for example, configured to be black or colored. For example, the housing material is colored by means of carbon black. As an alternative to this, the housing may also be colored white.

The cover layer preferably comprises silicone or a hybrid material. A hybrid material contains, for example, silicone and epoxide or another suitable mixture.

The casting compound preferably contains silicone.

The cover layer, which contains for example a hybrid material or silicone, exhibits good adhesion to the silicone casting material. It is therefore advantageously not necessary to use an adhesion promoter between the cover layer and the casting compound.

The housing, into which a casting compound comprising reflective particles contained therein is introduced, offers inter alia the following advantages:

economical production owing to the use of inexpensive pressing compounds e.g., consisting of epoxide for the component housing, which may also be used for applications in general lighting, ageing stability of the housing because of the reflective particles in the casting compound as radiation protection and concomitant light enhancement and corrosion protection for an optionally used silver coating or at least visual protection for tarnished silver by the casting compound, a robust component owing to the use of mechanically stable epoxide pressing compounds as the housing with thermal expansion coefficients adapted to copper and good adhesion to copper, for example when using a copper lead frame, so that a high component reliability can be achieved, reliability owing to the layer structure of the component consisting of a copper lead frame with an epoxide housing, silicone casting compound for example comprising $TiO_2$ particles, unfilled silicone or optionally silicone filled with a conversion material or diffuser applied thereon as a cover layer, as a result of which a stepwise increase of the thermal expansion coefficients of the individual components is made possible owing to this multilayer structure, so that a high component reliability and a low risk of delamination can be achieved.

Furthermore, the production of the component according to the invention can be integrated into the established process and process sequence without substantial modifications thereof. Another advantage is great freedom in the component and process design by means of alternative encapsulations or encapsulations which can be combined with one another, for example reflective encapsulation, clear encapsulation and volume conversion or lens integration.

The housing of the component may for example be configured to be black or white after production, depending on the respectively desired use of the component, for example black for display applications with high contrast.

In a method for producing a component comprising a housing and a semiconductor chip, the housing is produced by means of an injection pressing or injection molding method. Advantageous refinements of the method are obtained analogical to the advantageous refinements of the component, and vice versa.

Preferably, in a method for producing an optoelectronic component, the shaping of the housing is carried out by means of a tool which comprises a closed shape, the housing being at least partially cured in the tool. Preferably, the housing is subsequently cured further outside the tool.

Preferably, an etched or stamped lead frame is at least partially encapsulated by the housing material by means of an injection pressing or injection molding method. Preferably, the housing comprises a cavity, on the base surface of which the lead frame is free of the housing material. Particularly preferably, the lead frame comprises a first and a second terminal part, the semiconductor chip being mounted on one of the terminal parts and electrically connected to the other terminal part by means of a bonding wire.

Preferably, a casting compound is introduced into the cavity of the housing, the casting compound comprising reflective particles. Particularly preferably, the casting compound is introduced in such a way that the semiconductor chip protrudes beyond the casting compound in the vertical direction.

Particularly preferably, a cover layer, into which the semiconductor chip protrudes, is applied onto the casting compound. Preferably, the radiation exit side protrudes into the cover layer, the casting compound and cover layer directly adjoining one another.

In one refinement, the cover layer is shaped by means of a mold pressing process to form a lens.

In one refinement, the housing comprises a multiplicity of cavities, on the base surface of which at least one semiconductor chip is respectively applied, the housing subsequently being separated into individual components, in such a way that each separate component comprises at least one semiconductor chip.

Furthermore, semiconductor chip parts may be produced with a particular number of semiconductor chips. In this case, a cavity comprises a multiplicity of semiconductor chips. In this way, for example, it is possible to produce optoelectronic components which comprise a combination of emitter chips and detector chips.

In the method, individual components or entire arrays (semiconductor chip rows comprising a particular number of semiconductor chips) may in particular be produced. Mass production of the components is therefore possible, so that the production costs are advantageously reduced.

BRIEF DESCRIPTION OF THE DRAWINGS

Other features, advantages, refinements and expediencies of the component and its method may be found in the exemplary embodiments explained below in connection with FIGS. 1 and 2, in which:

FIGS. 1 and 2 respectively show a schematic cross section of an exemplary embodiment of a component according to the invention.

Elements which are the same or have the same effect are respectively provided with the same references. The elements represented and the size proportions of the elements with respect to one another are not to be regarded as true to scale.

DETAILED DESCRIPTION OF ILLUSTRATIVE EMBODIMENTS

FIGS. 1 and 2 respectively represent an optoelectronic component 10, which comprises a housing 1 and a semiconductor chip 2. The housing 1 comprises a cavity 4, in which the semiconductor chip 2 is arranged.

The housing 1 comprises a lead frame 5a, 5b. The lead frame 5a, 5b comprises a first 5b and a second terminal part 5a, which are used for electrical contacting of the semiconductor chip 2. The terminal parts 5a, 5b of the lead frame are electrically insulated from one another by housing material. The lead frame 5a, 5b may be an etched lead frame, which preferably comprises thinned regions. The thinned regions of the lead frame are preferably enclosed by the housing material by means of an injection pressing or injection molding method. This advantageously provides anchoring of the lead frame in the housing material.

The semiconductor chip 2 may be electrically conductively connected to the first terminal part 5b by means of a connecting layer, for instance an electrically conductive adhesive or solder layer, and/or it may be fastened thereto. In particular, the semiconductor chip 2 is fastened with a fastening side 2b on the first terminal part 5b. The semiconductor chip 2 is preferably electrically conductively connected to the second terminal part 5a by means of a bonding wire 7. The bonding wire preferably leads from the radiation exit side 2a of the semiconductor chip 2 to the second terminal part 5a.

The component comprises a pre-shaped housing, which may for example also be referred to as a so-called pre-molded housing. The shaping of the housing 1 is determined in the production process by means of a tool which has a closed shape, the housing being pre-cured in the tool and subsequently cured further outside the tool.

The semiconductor chip 2 comprises an active layer suitable for generating or detecting electromagnetic radiation. For example, the semiconductor chip 2 is an LED. Preferably, the semiconductor chip 2 is a thin-film LED. The semiconductor chip 2 is preferably based on a nitride, phosphide or arsenide compound semiconductor.

A casting compound 3, which preferably consists of silicone, is arranged in the cavity 4 of the housing. As an alternative or in addition, the casting compound 3 may also consist of a hybrid material comprising silicone and epoxide, or an epoxide. Reflective particles, in particular $TiO_2$ particles 3a, are distributed uniformly in the casting compound 3. In particular, the housing is filled with the casting compound to such an extent that the housing material is mostly covered with the casting compound. Owing to the reflective particles 3a introduced into the casting compound 3, the radiation emitted by the semiconductor chip 2 can be guided in the direction of the radiation exit surface of the component. A smaller proportion of the radiation emitted by the semiconductor chip 2 therefore strikes the housing 1, so that the proportion of radiation which strikes the housing material directly is minimized. In this way, material degradations of the housing can advantageously be minimized.

The casting compound comprising reflective particles contained therein is therefore used both as a reflector to increase the optionally directional light yield of the component and for a radiation protection for the possibly ageing-susceptible housing material. In this way, economical pressing compounds which are susceptible to radiation damage can be employed for the component housing. In particular, the damaging UV radiation which strikes the housing material is reduced by the casting compound formed in this way.

The lead frame 5a, 5b preferably consists of copper. A silver coating, an Au coating or an NiPdAu coating may be employed on the lead frame 5a, 5b. Furthermore, an epoxide pressing compound which has a thermal expansion coefficient adapted to copper and exhibits good adhesion to copper may be used as the housing material, as a result of which a robust component and a high component reliability can be achieved.

When using a lead frame comprising a coating, the casting compound with reflective particles contained therein is used at the same time as corrosion protection or at least as visual protection for a corroded lead frame.

A cover layer 6 is arranged on the casting compound. In the exemplary embodiment of FIG. 1, the cover layer 6 is arranged on the casting compound 3 in such a way that the cover layer 6 terminates outward flush with the upper side of the housing 1. The height of the housing therefore corresponds to the height of the casting compound plus the cover layer.

The cover layer 6 may contain a conversion material, which converts the radiation emitted by the semiconductor chip 2 into radiation having a different wavelength. In this way, it is possible to obtain a component which emits mixed radiation consisting of radiation emitted by the semiconductor chip 2 and conversion radiation, for example white radiation. The cover layer 6 is therefore used as a conversion layer in this case.

The component 10 comprises a three-part layer structure containing the housing 1, the casting compound 3 and the cover layer 6. In this way, the thermal expansion coefficient can advantageously be increased stepwise from component to component. For example, the housing material consisting of epoxide has a low thermal expansion coefficient from 1 to 18 ppm, while the cover layer preferably has a thermal expansion coefficient of about 150 to 300 ppm.

The semiconductor chip 2 preferably protrudes out of the casting compound 3 in the vertical direction. Preferably, the semiconductor chip 2 comprises a radiation exit side 2a which lies opposite the fastening side 2b and is free of casting compound. In particular, the casting compound 3 is arranged laterally with respect to the semiconductor chip 2 and fully encloses it laterally.

The cover layer 6 directly adjoins the casting compound 3. There is preferably no gap between the cover layer 6 and the casting compound 3. In particular, air inclusions due to production are not included in this.

The semiconductor chip 2 protrudes into the cover layer 6 in the vertical direction. In particular, the cover layer 6 at least locally surrounds the semiconductor chip 2. Preferably, the cover layer 6 is in direct contact with the radiation exit side 2a of the semiconductor chip 2. Radiation emitted by the semiconductor chip 2 therefore leaves the semiconductor chip at the radiation exit side 2a and passes through the cover layer 6, before it leaves the component.

The housing 1 preferably contains an epoxide, an epoxide pressing compound or PPA (polyphthalamide). The cover layer 6 preferably contains silicone or a hybrid material. The casting compound 3 preferably contains silicone.

In addition, it is possible to produce the component according to the invention in mass production (not shown). In particular, in this case a compound structure consisting of a multiplicity of the components may be produced. To this end, the housing 1 comprises a plurality of cavities, on the base surface of which there is respectively a terminal part of a lead frame free of the housing material and at least one semiconductor chip, i.e., one semiconductor chip or a plurality of semiconductor chips, is respectively applied on the terminal part of the lead frame of a cavity. A casting compound is respectively introduced into the cavities, a cover layer being applied on the casting compound. After production of the optoelectronic components in the compound structure, the compound structure can be separated into individual components or component arrays of a particular size, each separate component comprising at least one semiconductor chip. For the separation, to this end for example sawing is carried out in the cutting regions S1 or S2 represented in FIGS. 1 and 2.

The exemplary embodiment of FIG. 2 differs from the exemplary embodiment of FIG. 1 by the arrangement and configuration of the cover layer 6. In FIG. 2, the cover layer 6 is formed, for example by means of a mold pressing method, as a lens. Preferably, the lens is arranged in such a way in this case that it directly follows the radiation exit side of the semiconductor chip 2.

In contrast to the exemplary embodiment of FIG. 1, the component of FIG. 2 comprises a casting compound 3 which terminates with the upper side of the housing 1. The cover layer 6 is applied on the flatly formed upper side, which is composed of the housing upper side and the casting compound upper side. The cover layer 6 is therefore not introduced into the cavity 4 of the housing, but rests on the cavity and closes the component at the top.

In other regards, the component of FIG. 2 essentially corresponds to the component of FIG. 1.

In the optoelectronic components presented here, the e.g., black or white or differently colored housing may advantageously be protected against radiation, in particular UV radiation, by the casting compound e.g., having a white appearance.

By the description with the aid of the exemplary embodiments, the invention is not restricted to the exemplary embodiments. Rather, the invention encompasses any new feature and any combination of features, which may in particular comprise any combination of features in the patent claims, even if this feature or this combination is not itself indicated explicitly in the patent claims or exemplary embodiments.

The invention claimed is:

1. An optoelectronic component comprising:
    a housing;
    a semiconductor chip arranged in the housing, the semiconductor chip comprising an active layer suitable for generating or detecting electromagnetic radiation;
    a casting compound, wherein the casting compound at least partially encloses the semiconductor chip and wherein reflective particles are embedded in the casting compound; and
    a cover layer arranged on the casting compound, wherein a thermal expansion coefficient is increased stepwise from the housing to the casting compound to the cover layer.

2. The optoelectronic component according to claim 1, wherein the housing comprises a cavity on a base surface on which a lead frame is arranged, the semiconductor chip being arranged on the lead frame, and wherein the casting compound is introduced into the cavity.

3. The optoelectronic component according to claim 2, wherein the cover layer directly adjoins the casting compound.

4. The optoelectronic component according to claim 1, wherein a conversion material is embedded in the cover layer.

5. The optoelectronic component according to claim 1, wherein the cover layer is formed as a lens.

6. The optoelectronic component according to claim 1, wherein the semiconductor chip protrudes from the casting compound in a vertical direction and wherein the semiconductor chip protrudes in the vertical direction into the cover layer.

7. The optoelectronic component according to claim 1, wherein the cover layer and the casting compound contain silicone or a hybrid material.

8. The optoelectronic component according to claim 1, wherein the semiconductor chip protrudes from the casting compound in a vertical direction.

9. The optoelectronic component according to claim 1, wherein the housing contains polyphthalamide or epoxide.

10. The optoelectronic component according to claim 1, wherein
    the semiconductor chip protrudes from the casting compound in a vertical direction,
    the casting compound directly adjoins side surfaces of the semiconductor chip,
    the cover layer directly adjoins the casting compound,
    the semiconductor chip protrudes in the vertical direction into the cover layer and is in direct contact with the cover layer, and
    a material of the housing is an epoxide and has a thermal expansion coefficient from 1 to 18 ppm, while the cover layer has a thermal expansion coefficient of 150 to 300 ppm.

11. The optoelectronic component according to claim 1, wherein a material of the housing is an epoxide and has a thermal expansion coefficient from 1 to 18 ppm.

12. The optoelectronic component according to claim 11, wherein the cover layer has a thermal expansion coefficient of 150 to 300 ppm.

13. The optoelectronic component according to claim 1, wherein the cover layer has a thermal expansion coefficient of 150 to 300 ppm.

14. A method for producing an optoelectronic component, the method comprising:
    disposing a semiconductor chip in a housing, the semiconductor chip comprising an active layer suitable for generating or detecting electromagnetic radiation;
    forming a casting compound at least partially enclosing the semiconductor chip, wherein reflective particles are embedded in the casting compound; and
    applying a cover layer onto the casting compound, wherein a thermal expansion coefficient is increased stepwise from the housing to the casting compound to the cover layer.

15. The method according to claim 14, further comprising producing the housing an injection pressing or injection molding method.

16. The method according to claim 15, wherein the housing is shaped using a tool by at least partially curing the housing in the tool, the tool comprising a closed shape.

17. The method according to claim 14, wherein the casting compound is introduced into the housing in such a way that the semiconductor chip protrudes beyond the casting compound in a vertical direction.

18. The method according to claim 17, wherein the semiconductor chip protrudes through the cover layer.

19. A method for producing a structure with a plurality of components, the method comprising:
    providing a housing with a plurality of cavities;
    disposing a semiconductor chip within each of the cavities, each semiconductor chip comprising an active layer suitable for generating or detecting electromagnetic radiation;
    introducing a casting compound into the cavities to at least partially enclose the semiconductor chips, the casting compound comprising reflective particles;
    applying a cover layer onto the casting compound, wherein a thermal expansion coefficient is increased stepwise from the housing to the casting compound to the cover layer; and
    after introducing the casting compound, separating the housing into individual components, in such a way that each separate component comprises a semiconductor chip.

20. The method according to claim 19, wherein each separate component comprises exactly one semiconductor chip.

* * * * *

UNITED STATES PATENT AND TRADEMARK OFFICE
CERTIFICATE OF CORRECTION

PATENT NO. : 8,692,275 B2  
APPLICATION NO. : 13/636678  
DATED : April 8, 2014  
INVENTOR(S) : Harald Jaeger et al.

Page 1 of 1

It is certified that error appears in the above-identified patent and that said Letters Patent is hereby corrected as shown below:

In the Claims

In Col. 10, line 26, claim 15, after "housing" insert --using--.

Signed and Sealed this
Seventeenth Day of June, 2014

Michelle K. Lee
*Deputy Director of the United States Patent and Trademark Office*